(12) United States Patent  (10) Patent No.: US 8,002,592 B2
Crutcher et al.  (45) Date of Patent: Aug. 23, 2011

(54) DATA COLLECTING CONNECTION

(75) Inventors: Bernard C. Crutcher, Londonderry, NH (US); Christopher G. Chadbourne, Nashua, NH (US)

(73) Assignee: Hubbell Incorporated, Shelton, CT (US)

( * ) Notice: Subject to any disclaimer, the term of this patent is extended or adjusted under 35 U.S.C. 154(b) by 0 days.

(21) Appl. No.: 12/589,967

(22) Filed: Oct. 29, 2009

(65) Prior Publication Data

US 2010/0151735 A1    Jun. 17, 2010

Related U.S. Application Data

(60) Provisional application No. 61/203,038, filed on Dec. 17, 2008, provisional application No. 61/171,185, filed on Apr. 21, 2009.

(51) Int. Cl.
*H01R 4/50* (2006.01)
(52) U.S. Cl. .................... 439/783; 324/117 H
(58) Field of Classification Search ............... 439/488, 439/489, 783–785, 825, 851; 324/117 H, 324/117 R; 340/635; 174/845, 945
See application file for complete search history.

(56) References Cited

U.S. PATENT DOCUMENTS

| | | | |
|---|---|---|---|
| 1,924,793 A | 8/1933 | Laske | 106/287.18 |
| 3,354,517 A | 11/1967 | Levinsky | 403/275 |
| 3,771,356 A | 11/1973 | Mitchell et al. | 73/71.5 |
| 3,991,366 A | 11/1976 | Schweitzer, Jr. | 324/133 |
| 4,027,939 A | 6/1977 | White | 339/247 |
| 4,170,190 A | 10/1979 | Warner | 116/206 |
| 4,183,686 A | 1/1980 | De France | 403/11 |
| 4,268,818 A | 5/1981 | Davis et al. | 340/870.38 |
| 4,350,843 A | 9/1982 | Campbell et al. | 174/94 R |
| 4,384,289 A | 5/1983 | Stillwell et al. | 340/870.17 |
| 4,470,711 A | 9/1984 | Brzozowski | 374/179 |
| 4,746,241 A | 5/1988 | Burbank, III | 403/344 |
| 4,821,138 A | 4/1989 | Nakano et al. | 361/93 |
| 4,891,250 A | 1/1990 | Weibe et al. | 374/162 |
| 5,036,164 A | 7/1991 | Schrader et al. | 174/94 R |

(Continued)

FOREIGN PATENT DOCUMENTS

DE    10244304 B3    3/2004

OTHER PUBLICATIONS

Smart-Point "Two-page" document (Lindsey Manufacturing Company): http://www.lindesey-usa.com/catalogs/CVMI/Smart-Point%20Final, 2009.

(Continued)

*Primary Examiner* — Thanh-Tam T Le
(74) *Attorney, Agent, or Firm* — Harrington & Smith

(57) ABSTRACT

Disclosed herein is an apparatus. The apparatus includes a first body, a second body, and an electronic circuit. The first body includes a first end, a second end, and a middle section. The first body further includes a first conductor receiving area and a recessed cavity. The first receiving area extends from the first end to the second end. The cavity is at the middle section. The second body is adapted to be removably connected to the first body. The second body includes a first end, a second end, and a second conductor receiving area. The second conductor receiving area extends from the first end to the second end. The apparatus is adapted to receive an electrical conductor between the first receiving area and the second receiving area. The electronic circuit is at the cavity. The electronic circuit is configured to receive reference information corresponding to the electrical conductor.

37 Claims, 16 Drawing Sheets

U.S. PATENT DOCUMENTS

| | | | | |
|---|---|---|---|---|
| 5,103,068 A | 4/1992 | Schrader | | 174/94 R |
| 5,107,202 A | 4/1992 | Renda | | 324/96 |
| 5,162,615 A | 11/1992 | Schrader et al. | | 174/94 R |
| 5,181,026 A | 1/1993 | Granville | | 340/870.28 |
| 5,188,542 A | 2/1993 | Ballman | | 439/620 |
| 5,200,576 A | 4/1993 | Schrader et al. | | 174/94 R |
| 5,221,074 A | 6/1993 | Saracini | | 254/134.3 PA |
| 5,240,441 A | 8/1993 | Laricchia et al. | | 439/783 |
| 5,255,150 A | 10/1993 | Young et al. | | 361/107 |
| 5,552,564 A | 9/1996 | Schrader et al. | | 174/84 C |
| 5,567,175 A | 10/1996 | Warden et al. | | 439/490 |
| 5,748,095 A | 5/1998 | Horstmann | | 340/664 |
| 5,786,626 A | 7/1998 | Brady et al. | | 257/673 |
| 5,862,589 A | 1/1999 | Chadbourne et al. | | 29/882 |
| 6,005,484 A | 12/1999 | Ko | | 340/662 |
| 6,093,064 A * | 7/2000 | Callen et al. | | 439/783 |
| 6,114,941 A | 9/2000 | Scott | | 337/332 |
| 6,412,977 B1 | 7/2002 | Black et al. | | 374/178 |
| 6,525,270 B1 | 2/2003 | Connor et al. | | 174/84 C |
| 6,538,204 B2 | 3/2003 | Connor | | 174/84 R |
| 6,552,271 B2 | 4/2003 | Connor et al. | | 174/84 R |
| 6,784,802 B1 | 8/2004 | Stanescu | | 340/687 |
| 6,818,830 B2 | 11/2004 | O'Grady et al. | | 174/84 C |
| 6,846,989 B2 | 1/2005 | Sokol et al. | | 174/84 C |
| 7,348,489 B2 | 3/2008 | Chadbourne | | 174/74 R |
| 7,369,045 B2 | 5/2008 | Hansen | | 340/538.16 |
| 7,430,932 B2 | 10/2008 | Mekhanoshin et al. | | 73/865.9 |
| 7,786,894 B2 | 8/2010 | Polk et al. | | 340/870.07 |
| 7,882,629 B2 * | 2/2011 | Chadbourne | | 29/862 |
| 2005/0242086 A1 | 11/2005 | Imura | | 219/627 |
| 2005/0285735 A1 | 12/2005 | Imura et al. | | 340/539.27 |
| 2006/0006987 A1 | 1/2006 | Hashimoto et al. | | 340/10.51 |
| 2007/0141922 A1 | 6/2007 | Ross et al. | | 439/783 |
| 2008/0200078 A1 | 8/2008 | Waltz et al. | | 439/783 |
| 2008/0231463 A1 | 9/2008 | Feight | | 340/815.45 |
| 2010/0033345 A1 | 2/2010 | Polk et al. | | 340/870.07 |

OTHER PUBLICATIONS

Smart-Point "One page" document (Lindsey Manufacturing Company): http://www.lindsey-usa.com/catalogs/CVMI/CVMI%20Data%20Sheet, 2009.

"Transmission Line Security monitor can help protect nation's power grid", (Idaho national Laboratory): https://inlportal.inl.gov/portal/server.pt?open=514&objID-1269&mode=2&featurestory=DA__128177, Jun. 9, 2009, 2 pgs.

"Transmission Line Security Monitor" (Idaho national Laboratory): https://inportal.inl.gov/portal/server.pt/gateway/PTARGS_0__1332_809_255_1253_43/http://inlpublisher;7087/publishedcontent/preview/communities/inl_gov/newsroom/home__page_feature_stories/08.ga50087_08_web, Jun. 9, 2009, 2 pgs.

"Automatic Dead Ends for ACSR, AAAC & AAC Conductors", Hubbell/Fargo Mfg. Company, Inc., Aug. 1997, 8 pgs.

* cited by examiner

DATA COLLECTING CONNECTION

CROSS REFERENCE TO RELATED APPLICATION

This application claims priority under 35 U.S.C. §119(e) to U.S. provisional patent application No. 61/203,038 filed Dec. 17, 2008 and U.S. provisional patent application No. 61/171,185 filed Apr. 21, 2009, which are hereby incorporated by reference in their entireties.

BACKGROUND

1. Field of the Invention

The invention relates to data collecting and, more particularly, to a connection to an electrical conductor which collects data.

2. Brief Description of Prior Developments

U.S. Patent Publication No. 2007/0141922 A1 describes a clamp for an oil well line or gas well line with an electronic switch. U.S. Pat. No. 7,430,932 B2 discloses a device for telemonitoring the state of aerial power lines. U.S. Pat. No. 7,430,932 B2 discloses a device for telemonitoring the state of aerial power lines.

SCADA (Supervisory Control And Data Acquisition) generally refers to an industrial control system; a computer system monitoring and controlling a process. The SCADA industry is currently a multi-billion dollar business globally. To support growing interest in more effectively managing a utility's electrical load, a substantial amount of products designed to monitor, capture, store and report system and end user electrical usage exist. Methods of capturing and reporting usage have existed since the 1930s via chart recorders and leading into the electronic age.

SUMMARY

The foregoing and other problems are overcome, and other advantages are realized, by the use of the exemplary embodiments of this invention.

In accordance with one aspect of the invention, an apparatus is disclosed. The apparatus includes a first body, a second body, and an electronic circuit. The first body includes a first end, a second end opposite the first end, and a middle section between the first end and the second end. The first body further includes a first conductor receiving area and a recessed cavity. The first conductor receiving area extends from the first end to the second end. The recessed cavity is at the middle section. The second body is adapted to be removably connected to the first body. The second body includes a first end, a second end, and a second conductor receiving area. The second end is opposite the first end. The second conductor receiving area extends from the first end of the second body to the second end of the second body. The apparatus is adapted to receive an electrical conductor between the first conductor receiving area and the second conductor receiving area. The electronic circuit is at the cavity. The electronic circuit is configured to receive reference information corresponding to the electrical conductor.

In accordance with another aspect of the invention, an electrical wedge connector wedge is disclosed. The electrical wedge connector wedge includes a first conductor groove, a second conductor groove, a middle section, and at least one electronic component. The first conductor groove is adapted to receive a first conductor. The second conductor groove is opposite the first conductor groove. The second conductor groove is adapted to receive a second conductor. The middle section is between the first conductor groove and the second conductor groove. The at least one electronic component is at the middle section. The at least one electronic component is configured to monitor an electronic parameter of the first conductor. The electrical wedge connector wedge is adapted to be received by an electrical wedge connector shell.

In accordance with another aspect of the invention, a conductor suspension clamp is disclosed. The conductor suspension clamp includes a lower section, an upper section, and an electronic component. The lower section includes a lower groove portion. The lower section is adapted to be connected to a transmission tower. The upper section includes a first member and a second member. The first member includes an upper groove portion and a cavity. The conductor suspension clamp is adapted to receive an electrical conductor between the lower groove portion and the upper groove portion. At least a portion of the second member is at the cavity. The electronic component is proximate the cavity. The electronic component is configured to monitor a parameter of the electrical conductor.

In accordance with another aspect of the invention, a method of manufacturing an electrical based apparatus is disclosed. A first body having a first end, a second end opposite the first end, and a middle section between the first end and the second end, is provided. The first body is adapted to be connected to a second body with a conductor therebetween. A first conductor contact surface is provided at a side of the first body between the first end and the second end. A cavity is formed at the middle section. An electronic component is installed proximate the cavity. The electronic component is configured to monitor a parameter of the conductor. A plate member is provided at the middle section. The plate member covers the cavity.

In accordance with another aspect of the invention, an electrical dead-end connector is disclosed. The electrical dead-end connector includes an outer sleeve, a mechanical terminating section, and an electronic component. The outer sleeve is adapted to be connected to a transmission conductor. The outer sleeve includes a sleeve section and a pad section. The sleeve section receives at least a portion of the mechanical terminating section. An end of the mechanical terminating section is adapted to be connected to a transmission tower. The electronic component is connected to the outer sleeve. The electronic component is configured to monitor a parameter of the transmission conductor.

In accordance with another aspect of the invention, a splice electrical connector is disclosed. The splice electrical connector includes a sleeve section and an electronic component. The sleeve section has a general tube shape. The sleeve section is adapted to connect one transmission conductor to another transmission conductor. The electronic component is connected to the sleeve section. The electronic component is configured to monitor a parameter of at least one of the transmission conductors connected to the splice electrical connector.

BRIEF DESCRIPTION OF THE DRAWINGS

The foregoing aspects and other features of the invention are explained in the following description, taken in connection with the accompanying drawings, wherein.

DETAILED DESCRIPTION

The focus of this disclosure is not to recreate methods of capturing the data mentioned above, but as a method to facilitate an easier and far less expensive method of installing a device to capture this data. The growing movement of capturing, managing and as a result of Sep. 11, 2001 terrorist attack in the United States of America, of ensuring secure supply of energy as required by new FERC (U.S. Federal Energy Regulatory Commission) legislation has been dubbed the "Intelli-grid".

Figure 1:
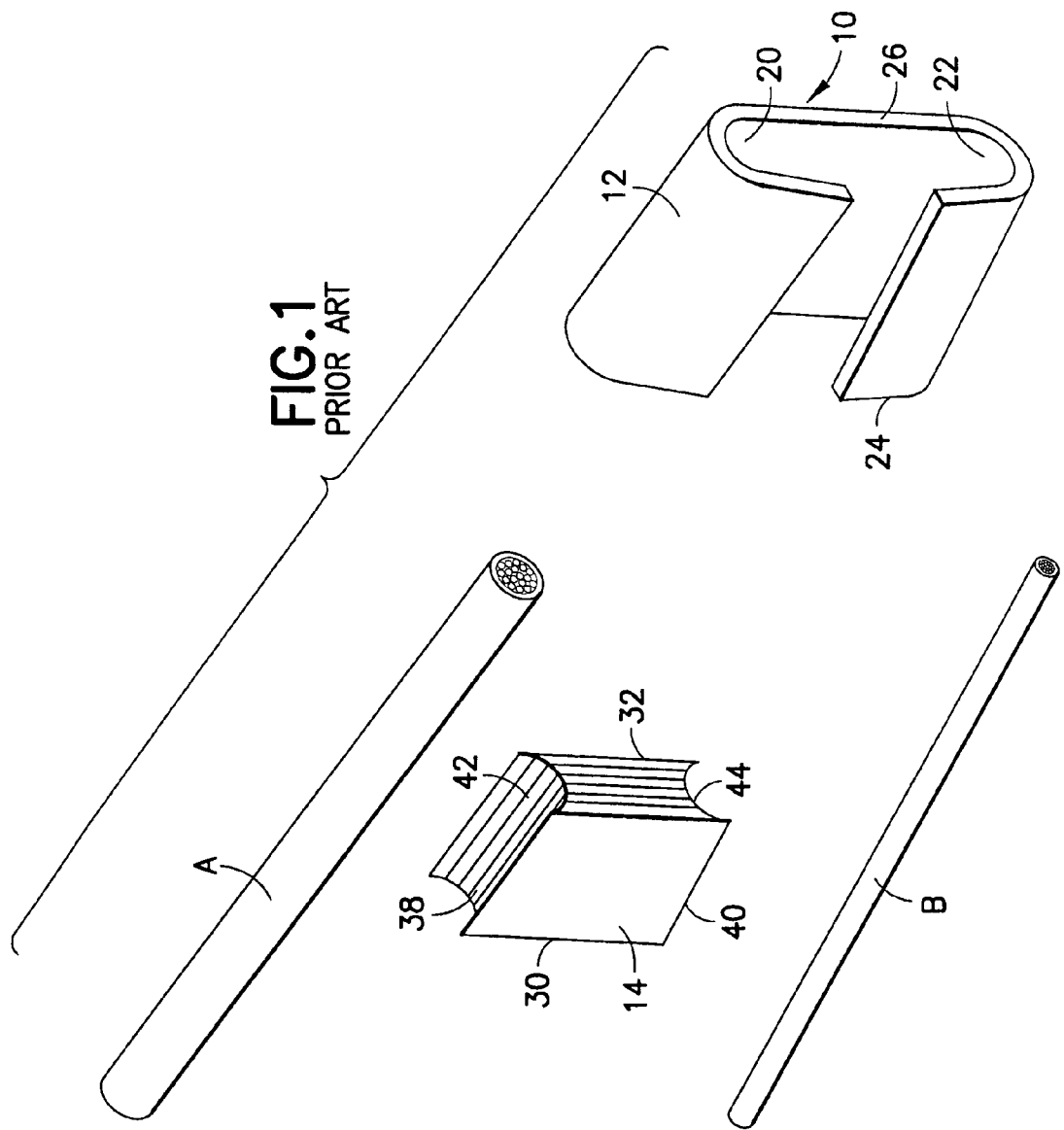
FIG. 1 is a perspective view of a conventional electrical wedge connector wedge, electrical wedge connector shell, and electrical conductors.

Referring to FIG. 1, there is shown an exploded perspective view of a conventional electrical wedge connector 10 and two electrical conductors A, B. The electrical wedge connector 10 generally comprises a shell and a wedge 14. The wedge 14 is inserted into the shell (or shell member) 12 between conductors A, B. The wedge/tapered shape of the shell member and the wedge member 14 provides for the shell 12 and the wedge 14 to be removably connected to each other as they are fastened together in a press fit or interference fit configuration. The conductors A, B are thus captured in shell 12 by wedge 14 thereby connecting the conductors A, B to each other.

The shell (or shell body) 12 of the wedge connector 10 has a general "C" shape forming two conductor receiving channels 20, 22 at opposite top and bottom sides of the shell. The shell 12 is tapered from a rear end 24 to a front end 26 to form a general wedge shape profile. Additionally, the conductor receiving channels (or conductor receiving areas) extend from the front end 26 to the rear end 24. In alternate embodiments, the shell of the wedge connector may have any other suitable shape.

Figure 2:
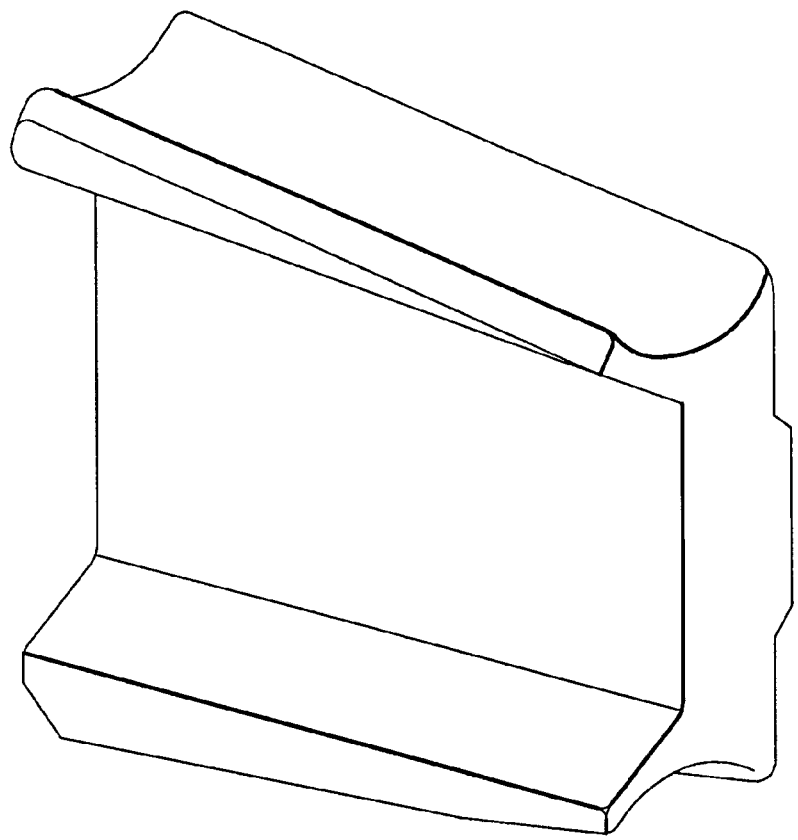
FIG. 2 is a perspective view of another conventional electrical wedge connector wedge.
Figure 3:
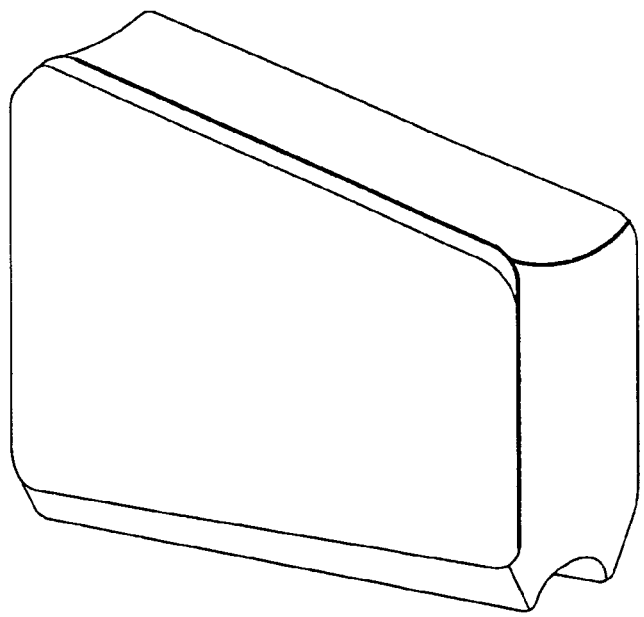
FIG. 3 is a perspective view of another conventional electrical wedge connector wedge.
Figure 4:
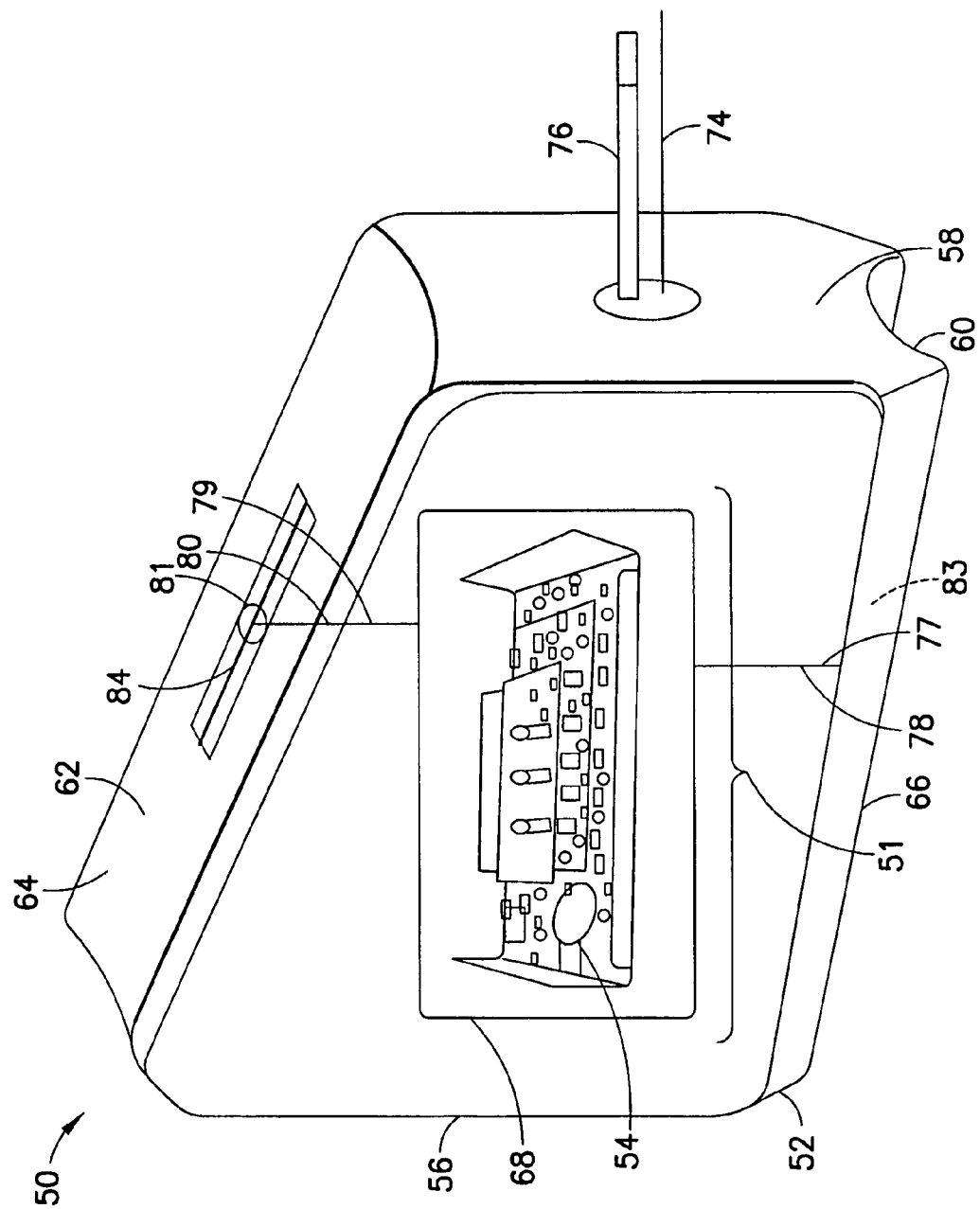
FIG. 4 is a perspective view of an electrical wedge connector wedge (insertable into the electrical wedge connector shell shown in FIG. 1) incorporating features of the invention.
Figure 5:
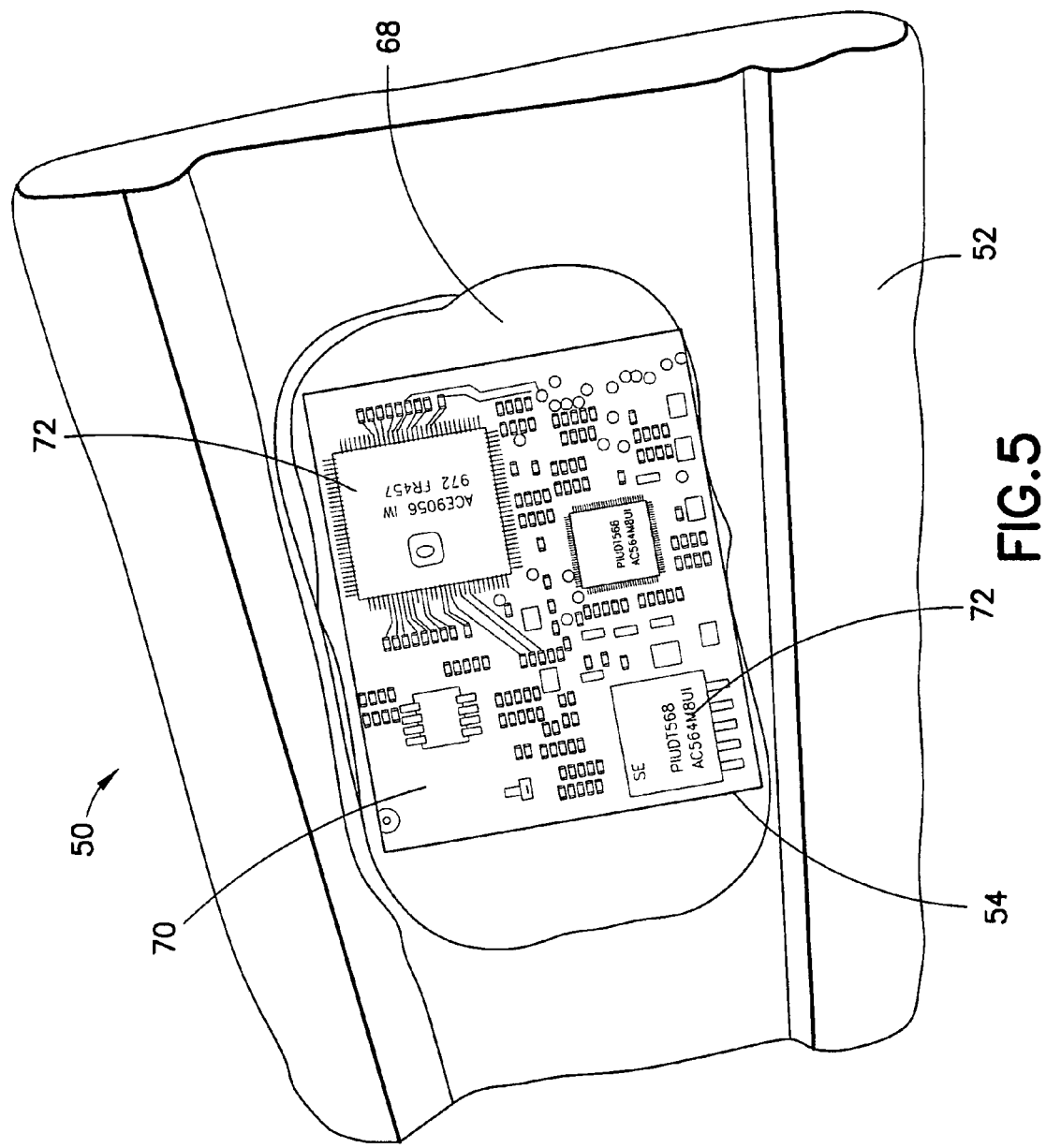
FIG. 5 is another perspective view of the electrical wedge connector wedge shown in FIG. 4.
Figure 6:
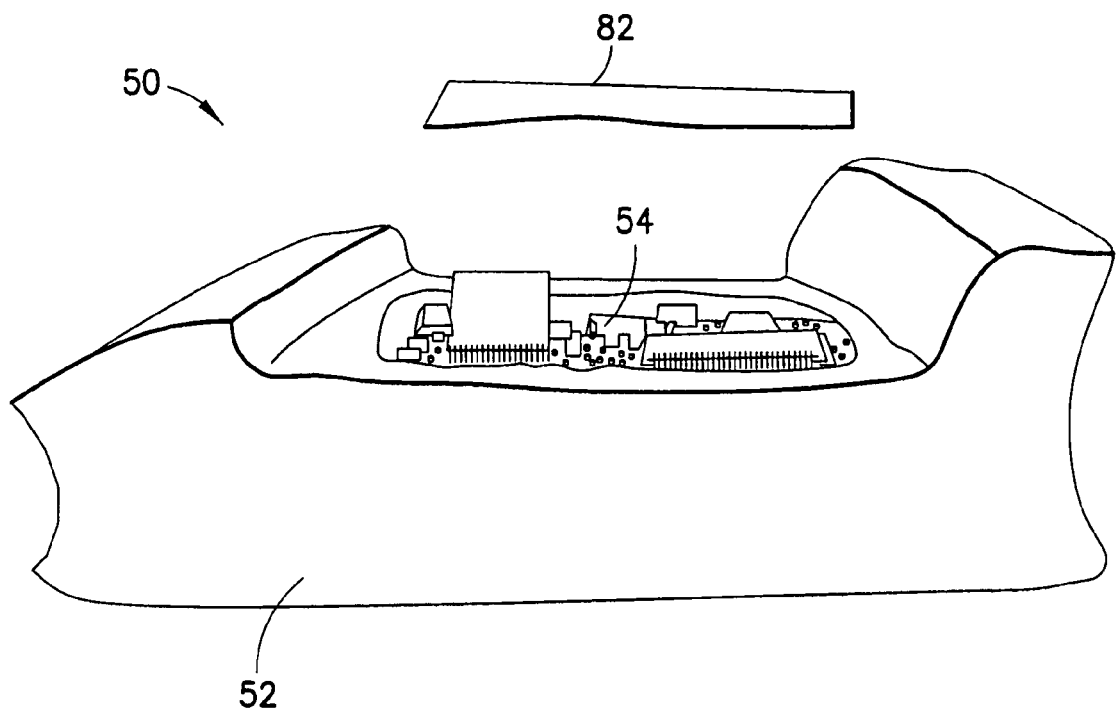
FIG. 6 is a rotated rear end view of the electrical wedge connector wedge shown in FIG. 4 and a cover plate member.

The wedge 14 is a one piece member comprised of metal, such as cast metal, but could be folded sheet metal or laminated sheet metal. The wedge 14 has a generally tapered shape from the rear 30 to the front 32. The wedge 14 forms conductor receiving areas 42, 44 at opposite top and bottom sides 38, 40 of wedge 14. FIGS. 2 and 3 show other examples of conventional wedges used in wedge electrical connectors adapted to connect tap/run electrical conductors carrying voltages ranging from about 5,000 to about 35,000 volts.

FIGS. 4-9 show a wedge 50 incorporating features of the invention intended to be used in the connector 10; replacing the wedge 14. Although the invention will be described with reference to the example embodiment shown in the drawings, it should be understood that the invention can be embodied in many alternate forms of embodiments. In addition, any suitable size, shape or type of elements or materials could be used.

The wedge 50 generally comprises a frame (or body) 52 and electronics 54. The frame 52 has a generally tapered shape from the rear end 56 to the front end 58. The wedge, or wedge member, 50 forms conductor receiving areas 60, 62 at opposite top and bottom sides 64, 66 of wedge 14. The conductor receiving areas (or conductor contact surfaces) 60, 62 extend from the front end 58 to the rear end 56. A middle area (or middle section) 51 of the frame 50 has a pocket 68. The electronics 54 are mounted in the pocket 68. A cover, or cover plate member, 82 (see FIG. 6) can be provided to cover the lateral side opening into pocket 68 after the electronics 54 are inserted into the pocket. This configuration allows the wedge 50 to be removably connected/fastened to the c-shaped shell body (or shell member) 12 as described above for the conventional wedge 14.

The electronics 54 comprises a printed wiring board (PWB or PCB) 70 with electronic circuitry and electronic components 72, such as integrated circuit chips for example. The PWB 70 can have an antenna or a separate antenna 74 could be connected to the PWB 70. An optical data (or fiber optic) cable 76 can additionally or alternative be connected to the PWB 70. The electronics 54 are preferably electrically insulated from the frame 50. However, the wedge 50 preferably has two electrical conductors or sensor leads 78, 80 which extend from the PWB 70 to the conductor receiving areas 60, 62, respectively. The leads 78, 80 are connected to conductive plates 81, 83 laying in retaining troughs. Conductive plates 81, 83, with slightly raised surface areas, will come into contact with conductors A, B. Electrical parameters (or reference information) from both conductors A and B can then be monitored and/or compared. In one type of embodiment the frame 52 could be comprised of electrically insulating material, such as very dense plastic or ceramic material.

The electronic based tap connector 10 (when installed in a conventional fashion onto electrical conductors A, B) can monitor, capture and store real time environmental, voltage and/or current information passing through the connector 10. Data outputs from the wedge 50 can be in the form of optical and/or radio since the device will be operating at system voltage and cannot come into contact with any ground reference. Data output formats can be in a consistent manner typical for the protocols used in the Utility DA/DSM market such as DNP3, ASCII, RS232, Optical or wireless radio that may deployed into WAN or LAN Internet system protocols.

More significantly, and relative to the future of the Intelligrid, is the potential for this device 10 to replace the KWh meter as we know it today. The KWh meter's key role is to record 1 and 3 phase KWh usage for billing purposes. Devices a fraction of that size can perform the same tasks and with equal or better accuracy.

Micro devices today are capable of performing large amounts of analysis in a very small package. Conceptually this device 10 could serve a multiple role of providing bidirectional usage information for both utility and consumer on usage parameters. Real time analysis available to both consumer and utility could help mitigate a nation's future power delivery dilemma.

A conventional wedge 14 can be modified to accept a microprocessor based electronic package into the wedge (such as in a retro fit package for example). A recessed cavity on the flat portion can be formed during production of the wedge frame between the tap and run grooves 60, 62 with sufficient depth to have a substantial portion of the electronics 54 within the cavity 68. This facilitates, electrical shielding, weatherproofing and risk of damage. A UV stabilized, long life cover 82 (see FIG. 6), suitable to protect the electronics from HV electromagnetic interference and weather related elements can snap over the electronics.

Figure 10:
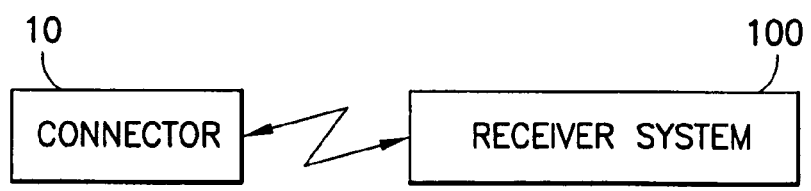
FIG. 10 is a schematic drawing illustrating the connector/clamp and a receiver system.
Figure 7:
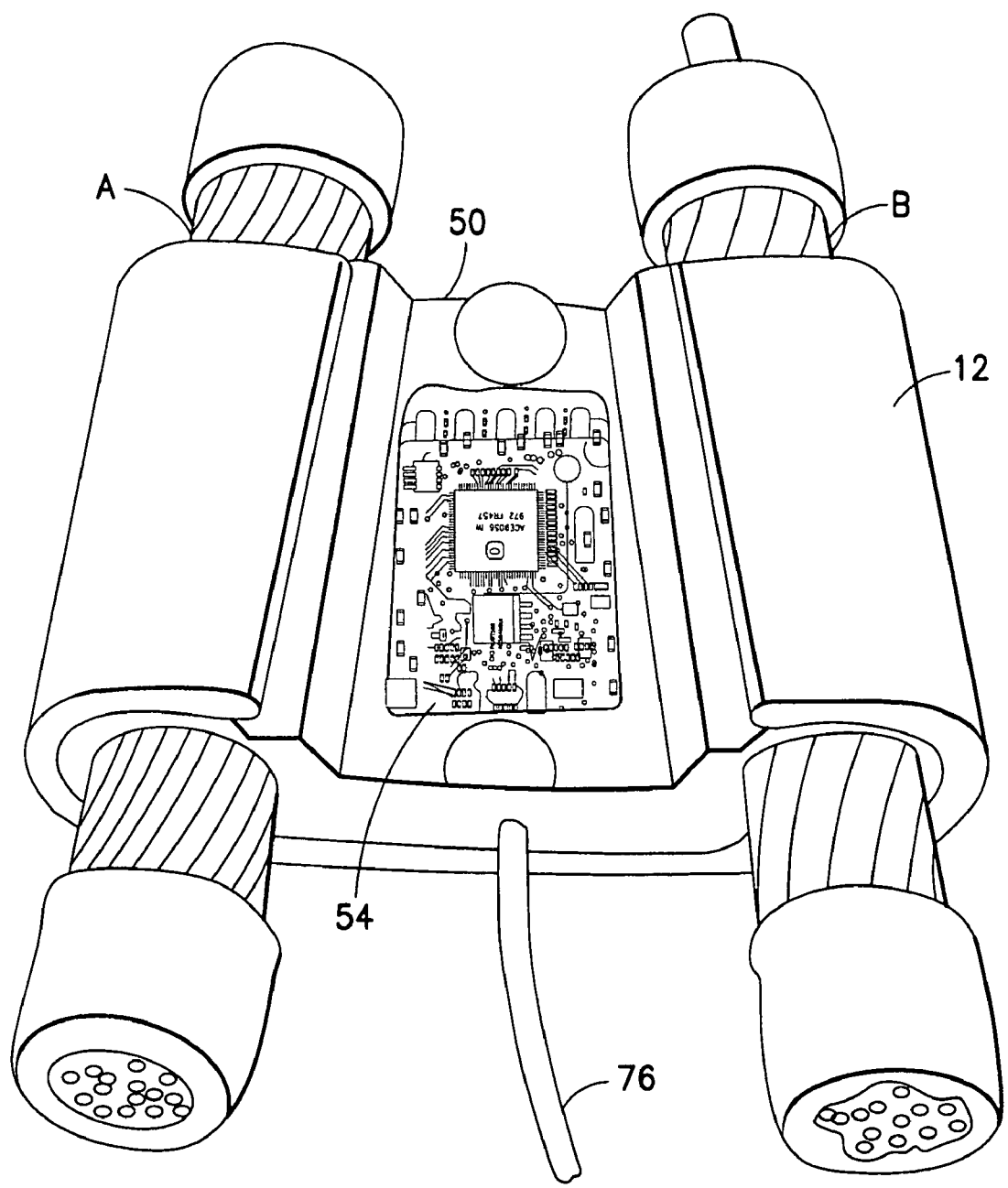
FIG. 7 is a perspective view of the electrical wedge connector wedge shown in FIG. 4 inserted into the shell with conductors therebetween.
Figure 8:
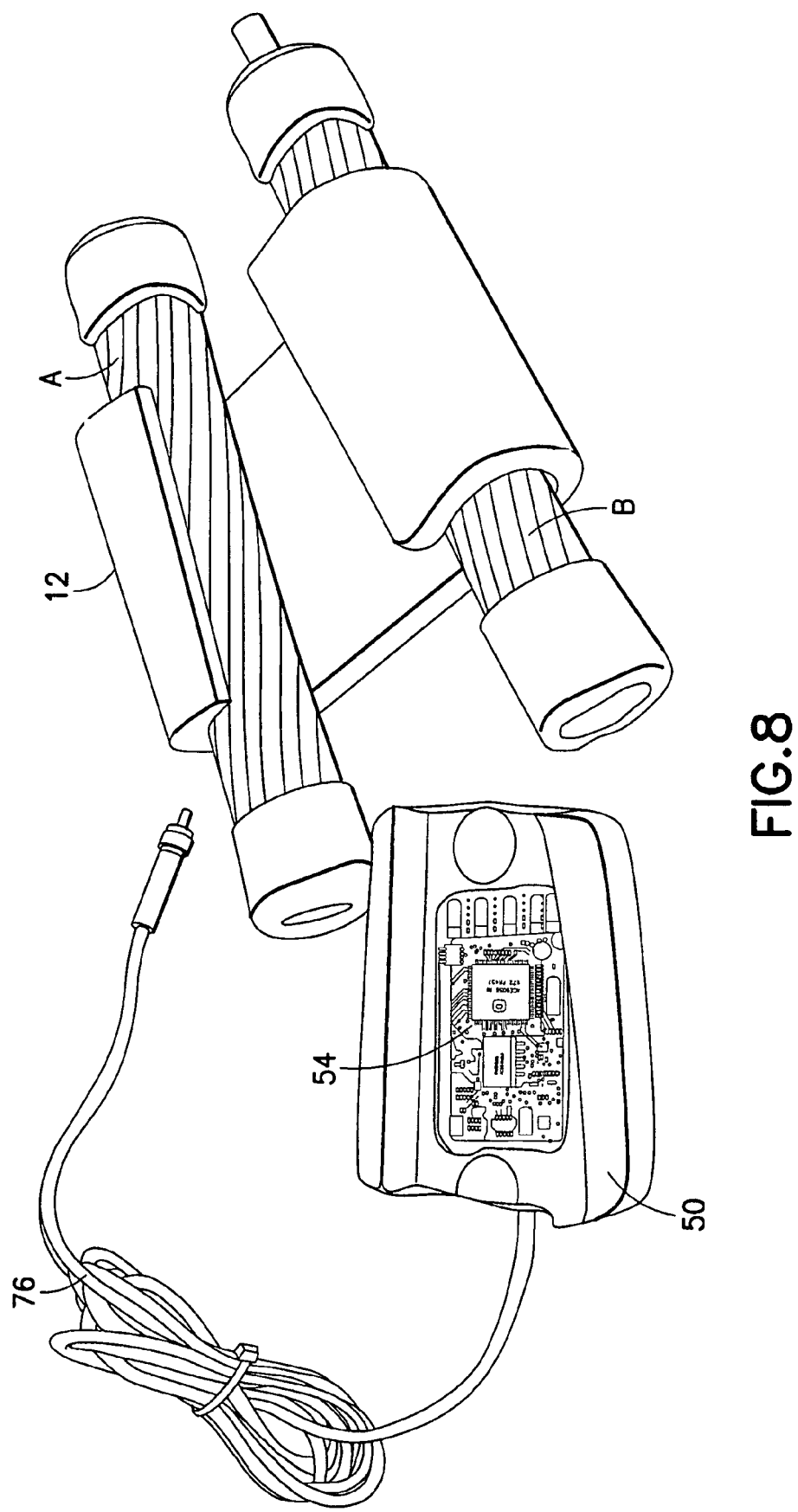
FIG. 8 is a perspective view of the electrical wedge connector wedge shown in FIG. 4 removed from the shell and the conductors.
Figure 9:
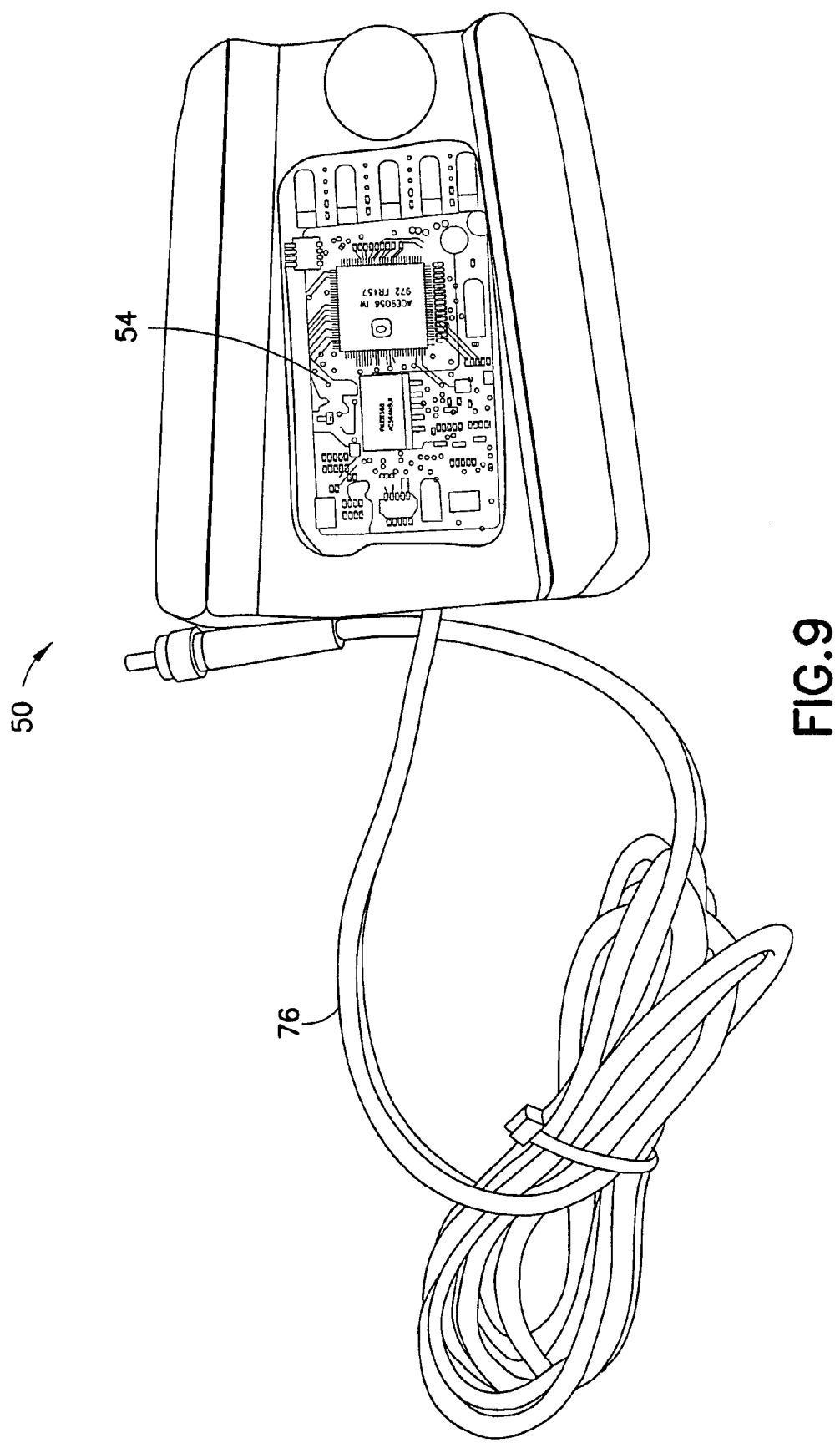
FIG. 9 is perspective view of the electrical wedge connector wedge shown in FIG. 4.

The electronic package, or electronic circuit, can obtain data in the following manner. The electronic package 54 is housed midpoint between both the run and tap connector grooves. As outlined below, the electronic package can read and record a voltage on the conductor(s), current on the conductor(s), and/or temperature of the conductor(s). Data can be collected real time at a sample rate fast enough to see changes, such as at 1 ms or higher for example. The microprocessor can collect samples at a user predetermined rate for storage to the onboard memory for later extraction. The package 54 could have any suitable software to record and/or transmit information obtained by the package. The electronics 54 can include a transceiver. As illustrated by FIG. 10, information can be transmitted from the connector 10 to a receiver system 100.

A small hole (such as ⅛ inch for example) can be drilled midpoint perpendicular into each of the Tap and Run grooves to provide access into the recessed cavity 68. Through these holes 77, 79 are inserted small shielded wires 78, 80 that connect to the electronic package mounted in the recessed cavity 68.

The other end of the wires 78, 80 emerging from the recessed cavity into the conductor grooves is preferably attached to a small curved conductive material mounted in each conductor groove 60, 62 that will serve as a connection point to the conductor in that respective groove. Data sensing and data collection can then be accessed by the micro processor using voltage, current, inductive, resistive and phase angle comparative algorithms between the run and tap connection points.

The package 54 can be powered through inductive coupling; not unlike many other electronic based packages serving the SCADA market.

Figure 11:
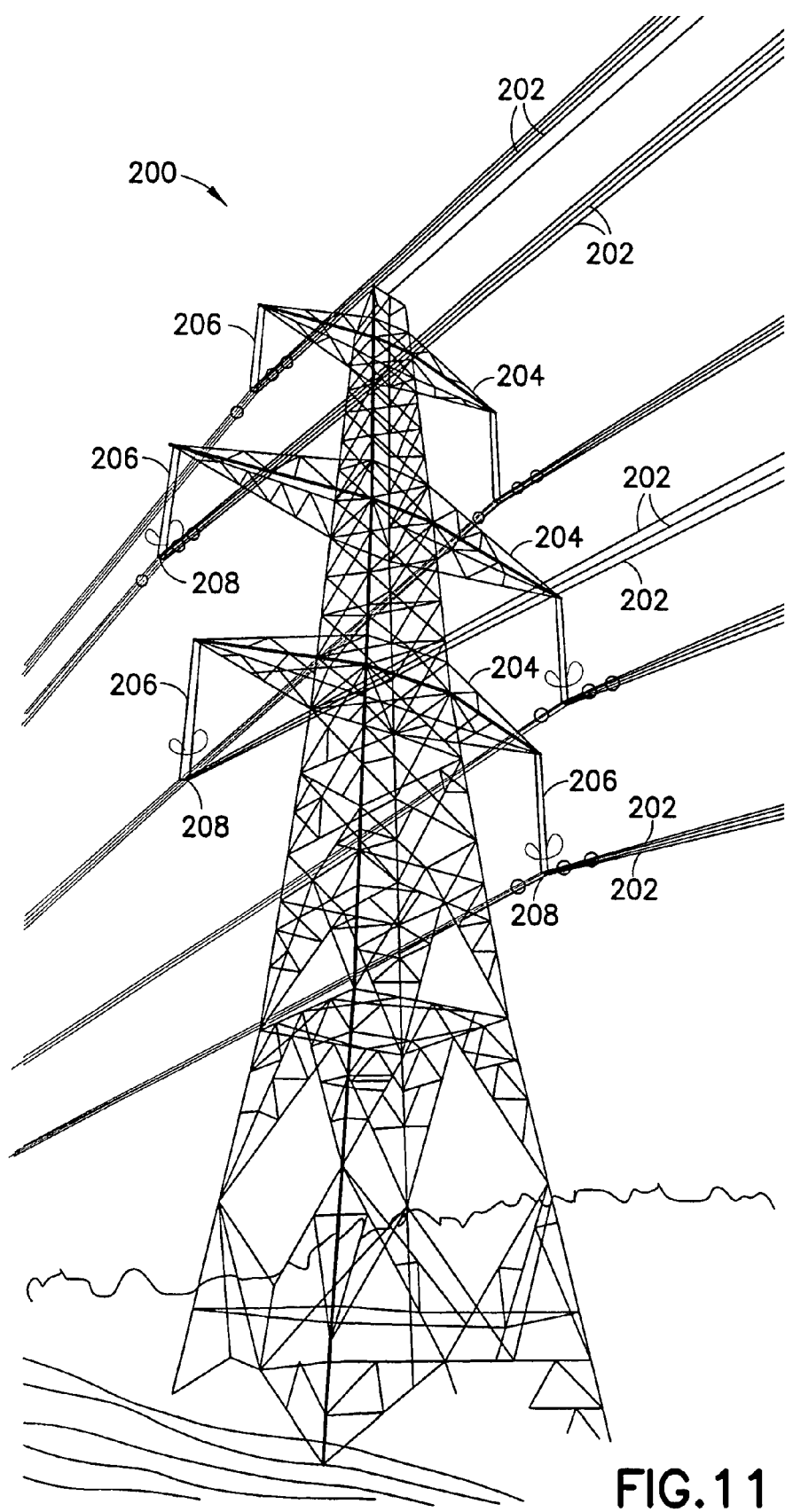
FIG. 11 is a perspective view of a transmission tower comprising suspension clamps incorporating features of the invention.

Referring now also to FIG. 11, another example embodiment of the invention will be described. FIG. 11 shows a transmission tower 200 which is used to suspend power transmission lines 202 above the ground. The tower 200 has cantilevered arms 204. Insulators 206 extend down from the arms 204. One or more suspension clamps 208 are located at the bottom ends of the insulators 206. The lines 202 are connected to the suspension clamps.

Transmission terminology generally relates to an electrical conductor carrying voltages ranging from about 69,000 to about 765,000 volts and above. Transmission lines, wherever they exist on the planet, are the backbone of any power delivery system that must cost effectively deliver power from the generating source to our homes and businesses. In many cases transmission line distances may span hundreds of miles. Little or no information has been available about electrical or environmental conditions that are occurring at any given time on the transmission system between the generation source and the substation where the high voltage is reduced to lower voltages that ultimately end up at the consumer.

This example embodiment relates to an electronic based apparatus designed into a high voltage transmission conductor suspension clamp. Conventional transmission suspension clamps are common in the industry and extensively used, but are designed to merely provide a mechanical means of suspending the transmission conductor safely and securely to the transmission tower. The suspension clamp is connected via miscellaneous hardware, commonly called "string hardware" to insulators that are in turn attached to the transmission tower. The suspension clamp has historically been manufactured out of high strength steel or similar metal and its only function is to clamp onto and securely suspend the conductor.

The new example embodiment of the invention incorporates electronic sensing circuitry into a transmission suspension clamp to allow utilities to gather key information about electrical and environmental conditions occurring at a remote site. The device can operate in a high voltage environment ranging up to 765,000 volts and above. This environment creates electromagnetic and electrical fields that create stress for the sensing electronics. The features of this new electronic suspension clamp can sense and report electrical (Voltage and Current), temperature, optical, tensile and vibration parameters that are present in/on and around the conductor/line being suspended. These key parameters will allow further diagnosis by the user on the operating condition of the line from many miles away.

Figure 12:
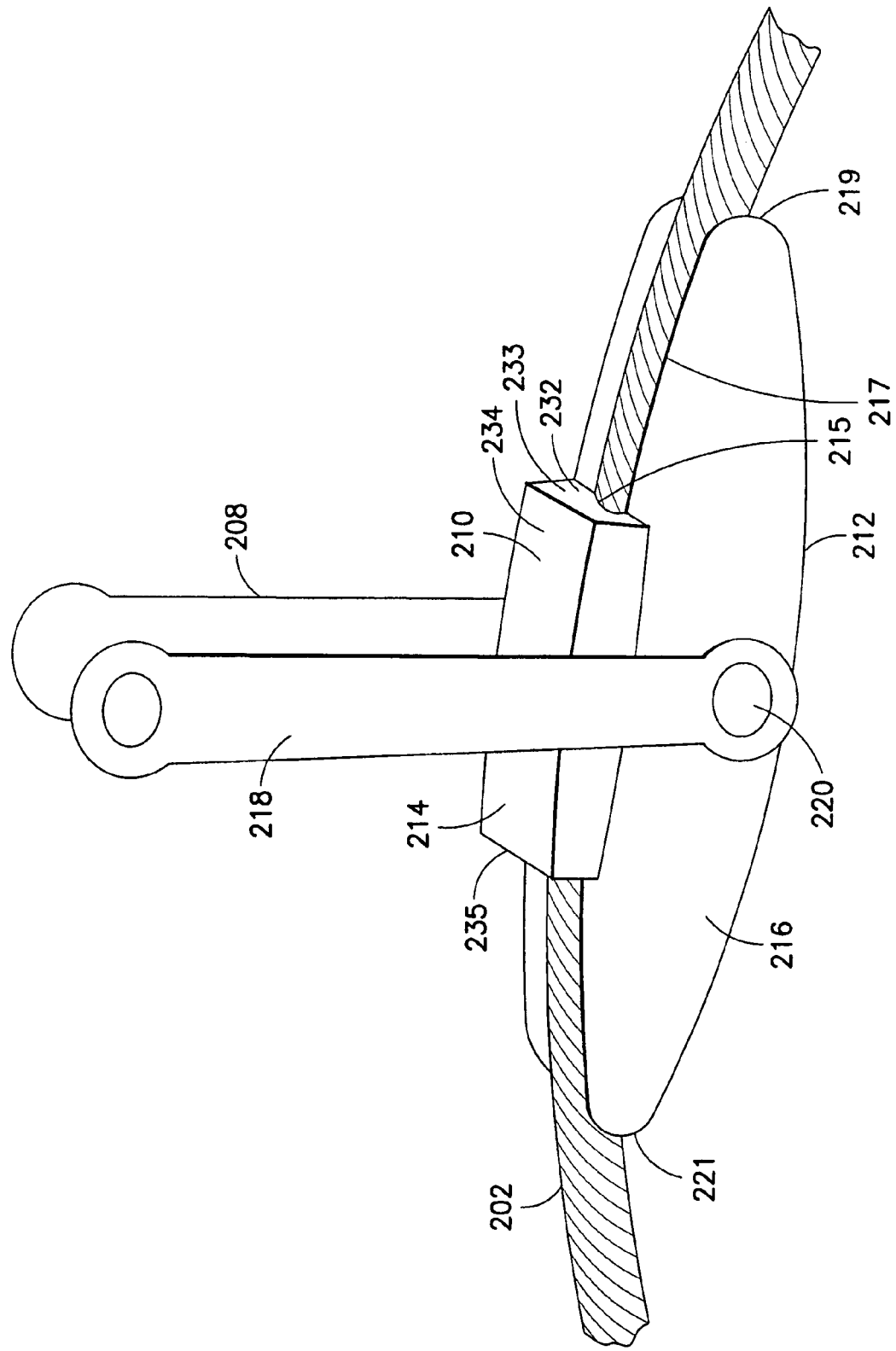
FIG. 12 is a perspective view of one of the suspension clamps in shown in FIG. 8 incorporating features of the invention.
Figure 13:
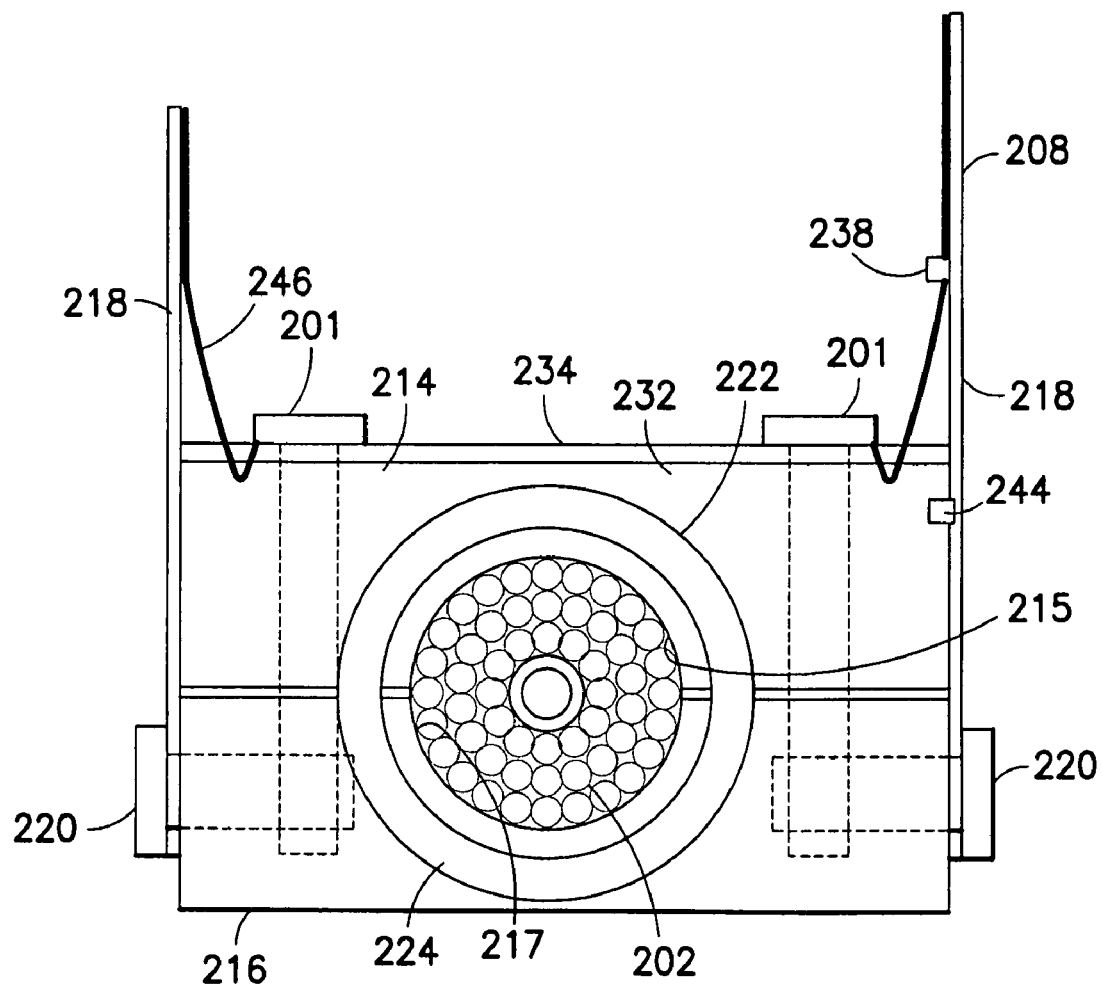
FIG. 13 is a cross section view of the suspension clamp shown in FIG. 9.
Figure 14:
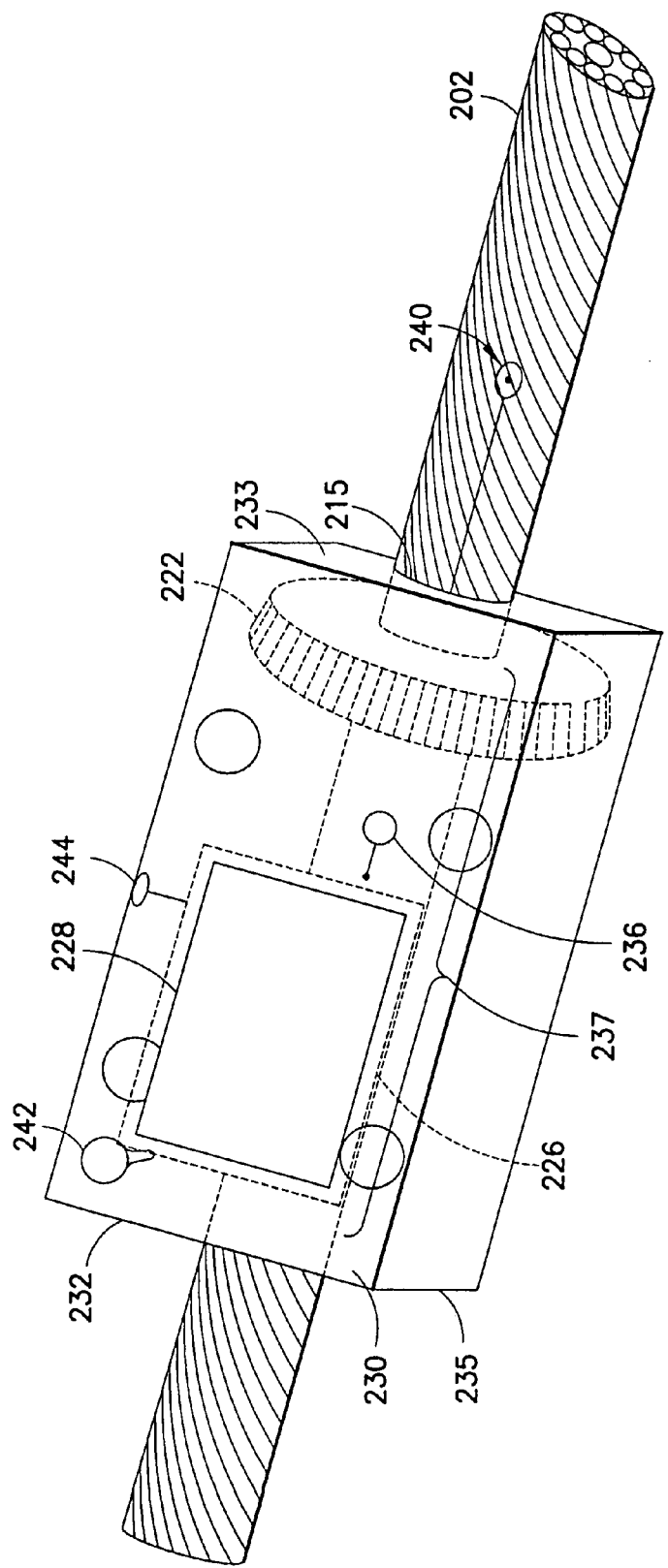
FIG. 14 a perspective view of a first member of the suspension clamp shown in FIG. 8.

Referring also to FIGS. 12-14, the example embodiment of the suspension clamp 208 generally comprises an upper section 210 and a lower support section 212. These two sections 210, 212 each contain a body 214, 216 which form a suspension case. The bodies 214, 216 each comprise a longitudinal trough (or conductor receiving area) 215, 217 that allow the transmission conductor 202 to be securely seated within the two sections and when the two sections are bolted (or fastened) together by threaded fasteners 201. This sandwiches the transmission conductor 202 between the two bodies to securely contain the transmission conductor 202 on the clamp 208. However, it should be noted that threaded fasteners are not required and any other suitable fastening configuration may be provided.

The two bodies 214, 216 connected together are suspended via a metal bracket 218 that attaches to the lower body 216 at points via bolt hardware 220.

The lower body, or lower body section, 216 comprises a first end 219 and a second end 221. The conductor receiving area (or conductor contact surface) 217 extends from the first end 219 to the second end 221 along a top side of the lower body 216. The conductor receiving area 217 forms a lower groove portion for contacting a lower half of the conductor 202. However, it should be noted that a general groove shape is not required, and any suitable configuration may be provided.

The upper and lower sections 210, 212 each have imbedded within their respective bodies 214, 216 one-half of a current transformer 222, 224 that is commonly referred to in the industry as a split core transformer. When these components 222, 224 are joined they form an electromagnetic circuit that allows the sensing of current passing through the conductor 202.

The body 214 of the upper section 210 contains a first member 232 and a second member 234 forming a cover plate. The first member 232 comprises a first end 233, a second end 235, and a middle section 237 between the first end 233 and the second end 235. The conductor receiving area (or conductor contact surface) 215 extends from the first end 233 to the second end 235 along a bottom side of the first member 232. The conductor receiving area 215 forms an upper groove portion for contacting an upper half of the conductor 202. However, it should be noted that a general groove shape is not required, and any suitable configuration may be provided. The first member 232 further comprises a recessed cavity 226 at the middle section 237 that effectively contains an electronic circuit 228. The electronic circuit 228 is designed to accept inputs from several sensing components. This cavity 226 is surrounded by a faraday cage 230 to effectively nullify the effects of high voltage EMF influence from the conductor 202 on the circuitry 228. The faraday cage also surrounds the current transformer 222. The cover plate, or cover plate member, 234 can cover the top opening to the cavity 226 to retain the electronic circuit inside the body, or upper body section, 214. The electronics can be housed in a steel container, surrounded by the faraday cage, and the entire assembly can be potted, such as with epoxy for example.

The electronic circuit 228 can accept and quantify in a meaningful manner various inputs for monitoring various parameters of the conductor 202. The inputs can be derived from externally mounted electronic referencing devices/components. The inputs can include, for example: 1) Line Voltage reference (as derived from the faraday cage 230). 2) Line Current reference (as derived from the Current transformer 222, 224). 3) Barometric pressure and Temperature references—internal and ambient (as derived from internal and external thermocouples 236, 238). 4) Vibration references of the conductor (as derived from the accelerometer 240, such as a 10-150 KHz vibration sensor for example). 5) Optical references (as derived from the photo transistor 242 in a fiber optic tube). The optical reference portion may, for example, allow the clamp to look up and see flashes of light from corona if the insulator starts to fail, or lightening indication storm activity, and/or tensile references (as derived from the tension strain device 244). The tensile references from the tensile indicators 244 may, for example, provide information indicating that ice is forming as the weight of the conductor increases due to ice build up.

Information derived by the electrical/electronic circuitry will preferably exit the circuit 228 via a non-conductive fiber optic cable 246 that is impervious to EMF/EMI influences and, therefore, can safely travel up and over to the transmission tower 200 and ultimately end up at the base of the tower and feed into the user's SCADA system. The end users can then access and view electrical and environmental conditions at that sight, or the information can be transmitted to a remote or central site. According to another embodiment of the invention, the suspension clamp may be configured to wirelessly transmit information from the electronic circuit 228 to a receiver system. However, any suitable configuration for transmitting or sending information may be provided.

A conventional suspension clamp can be modified to accept the electrical/electronic circuitry and the electronic components (such as in a retro fit package for example). A recessed cavity on the upper body can be formed during production of the upper section with sufficient depth to have a substantial portion of the electronics 228 within the cavity 226.

According to another example of the invention, a method of manufacturing an electrical based apparatus is disclosed. The method includes the following steps. Providing a first body having a first end, a second end opposite the first end, and a middle section between the first end and the second end, wherein the first body is adapted to be connected to a second body with a conductor therebetween. Providing a first conductor contact surface at a side of the first body between the first end and the second end. Forming a cavity at the middle section. Installing an electronic component proximate the cavity, wherein the electronic component is configured to monitor a parameter of the conductor. Providing a plate member at the middle section, wherein the plate member covers the cavity. It should be noted that any of the above steps may be performed alone or in combination with one or more of the steps.

Figure 15:
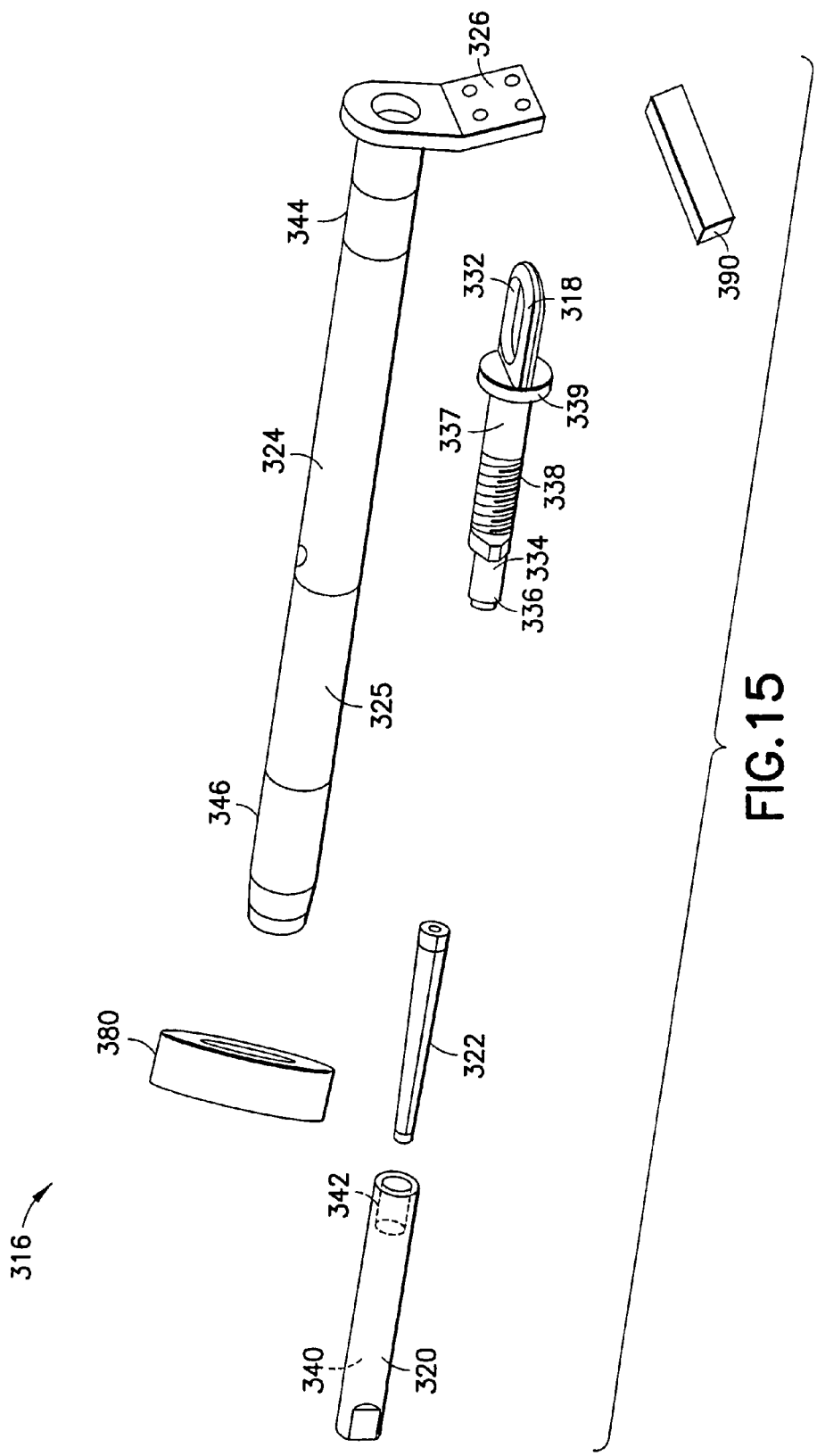
FIG. 15 is an exploded view of an electrical connector incorporating features of the invention.
Figure 17:
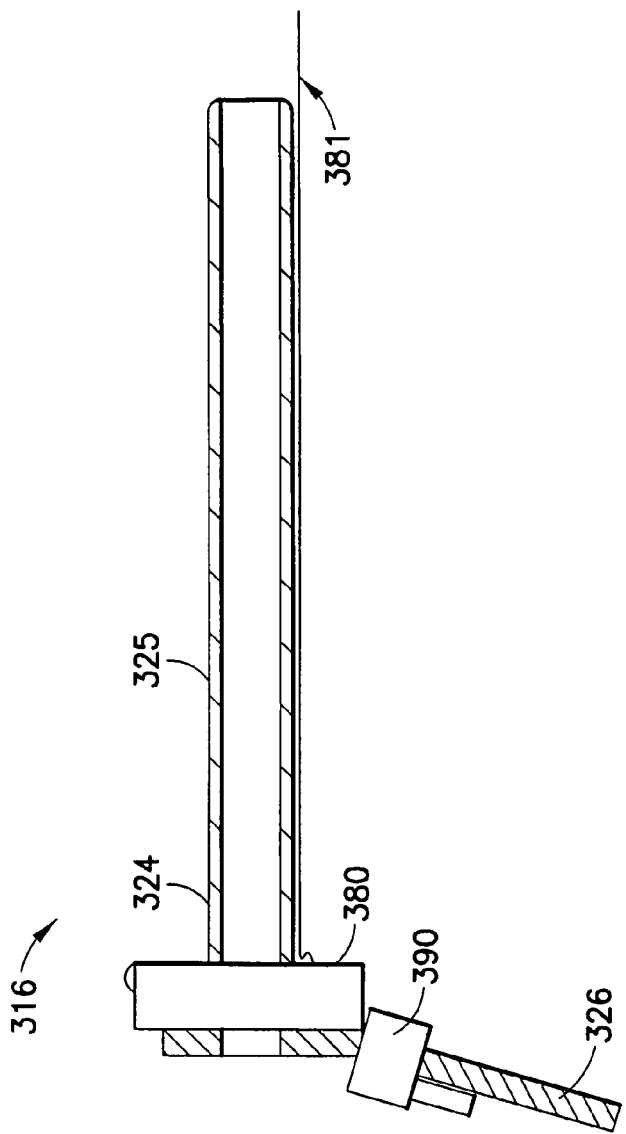
FIG. 17 is a side view of the outer sleeve used in the electrical connector shown in FIG. 15.
Figure 16:
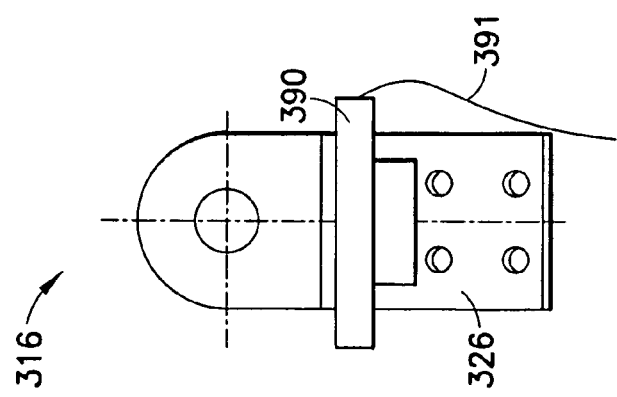
FIG. 16 is an end view of an outer sleeve used in the electrical connector shown in FIG. 15.

According to another embodiment of the invention, an electrical cable connector 316, which may be dead end (or conductor terminating dead-end) connector adapted to mechanically connect an end of a cable to another member, such as a transmission tower, is shown in FIG. 15. The connector 316 generally comprises a dead end connector member 318, a wedge sleeve member (or collet housing) 320, wedges 322, an outer tube portion (or outer sleeve) 324, and an electronic sensing package 380, 390. Similar dead end connectors (without the electronic sensing package, for example) and a method of attaching the connector to the cable is described in U.S. patent application Ser. No. 12/017,736 filed Jan. 22, 2008 which is hereby incorporated by reference in its entirety.

Referring also to FIGS. 16-19, the outer sleeve 324 may comprise a sleeve section 325 and a pad portion (or jumper pad) 326 for electrically connecting a connector of another cable assembly to the connector 316. The pad portion, or pad section, 326 may also be connected to a terminal connection. The pad section 326 comprises a formed shape of electrically conductive material. However, any suitable shape or configuration for the pad section 326 may be provided. It should also be noted that in alternate embodiments, the pad portion 326 need not be provided.

The connector 316 is configured to be connected to a cable (not shown). The connector 316 may be used with any suitable power line, such as composite core or steel core power transmission lines for example.

The dead end connector member (or mechanical terminating section) 318 may comprise a one-piece metal structural member, such as steel or aluminum, having an eyelet (or looped end) 332 at a first end section and an opposite second end section 334 with a threaded section 336. The dead end connector member 318 may further comprise a ridge section (or rib section) 338. The eyelet 332 is adapted to be connected to another member, such as a transmission tower. The dead end connector member 318 may also comprise a shaft portion 337 and a flange portion 339 between the rib section 338 and the eyelet 332. The shaft portion may be proximate, or adjacent, the rib section. The flange portion 339 may be proximate the eyelet 332. However, any suitable configuration may be provided. The wedge sleeve 320 is preferably a one piece metal member, such as a steel conduit. The wedge sleeve 320 has a general tube shape with an inner channel 340 having a threaded section 342 at a first end and may further comprise a tapered section extending away from the threaded section 342.

The wedges 322 comprise two wedges each having a general C shaped cross-section. However, in alternate embodiments, more than two wedges could be provided. As another alternate embodiment, only a single wedge might be provided which has slots forming multiple deflectable arms. The outer sides of the wedges are suitably sized and shaped to be able to slide against the inside surface of the wedge sleeve 320. The inner sides of the wedges are adapted to grip onto the exterior surface of a core of the cable.

The outer tube portion (or outer sleeve) 324 may be made of electrically conductive material, such as aluminum, for example. The sleeve section 325 of the outer tube portion 324 has a general tube shape. The sleeve section 325 is located around the wedge sleeve 320. A first end 344 of the sleeve section 325 is located over the ridge section 338 of the dead end connector member 318. A second end 346 of the sleeve section 325 is located over wires of the cable. The sleeve section 325 is adapted to be connected, via displacement of the sleeve, to the transmission conductor. The pad portion 326 may also form a flange at the first end 344 of the outer sleeve 324 (and the sleeve section 325). However, any suitable configuration may be provided.

An electronic sensing package 380, 390 may be provided on the connector 316. According to one embodiment, the electronic sensing package 390 may be provided at the deadend pad 326. According to another embodiment, the electronic sensing package 380 may be provided on the first end 344 of the sleeve section 325. According to yet another embodiment, the connector 316 may be provided with both the electronic sensing package 390 at the deadend pad 326 and the electronic sensing package 380 on the sleeve section 325. However, any other suitable location or combination of locations for the electronic sensing package(s) may be provided.

Figure 19:
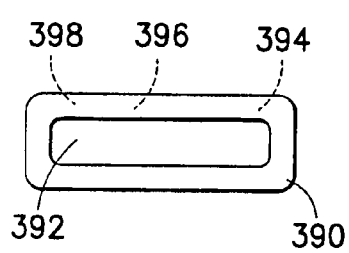
FIG. 19 is a front view of another electronic sensing package used in the electrical connector shown in FIG. 15.

The electronic sensing package 390 may comprise a general rectangular shape with an opening 392 (see FIG. 19). However, any suitable shape may be provided. The opening 392 may be suitably sized and shaped to be fitted around the pad portion 326. The electronic sensing package 390 may be attached to the pad portion 326 by any suitable method, such as a press fit for example. The electronic sensing package 390 may comprise embedded electronics 394. The embedded electronics 394 may include one or more electronic components 396 and/or an electronic circuit 398. However, any suitable electronics may be provided. Similar to the embodiments presented above, the electronics 394 are configured to monitor one or more parameters of the cable conductor connected to the connector 316. The electronic sensing package 390 may further comprise a non-conductive fiber optic link 391 for connection to a utility SCADA system.

Figure 18:
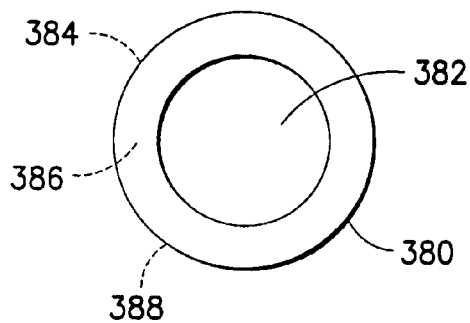
FIG. 18 is a front view of an electronic sensing package used in the electrical connector shown in FIG. 15.

The electronic sensing package 380 may comprise a general ring shape with an opening 382 (see FIG. 18). However, any suitable shape may be provided. The opening 382 may be suitably sized and shaped to be fitted around the sleeve section 325. The electronic sensing package 380 may be attached to the sleeve section 325 by any suitable method, such as a press fit for example. The electronic sensing package 380 may comprise embedded electronics 384. The embedded electronics 384 may include one or more electronic components 386 and/or an electronic circuit 388. However, any suitable electronics may be provided. Similar to the embodiments presented above, the electronics 384 are configured to monitor one or more parameters of the cable conductor connected to the connector 316. The electronic sensing package 380 may further comprise a non-conductive fiber optic link 381 for connection to a utility SCADA system.

Figure 20:
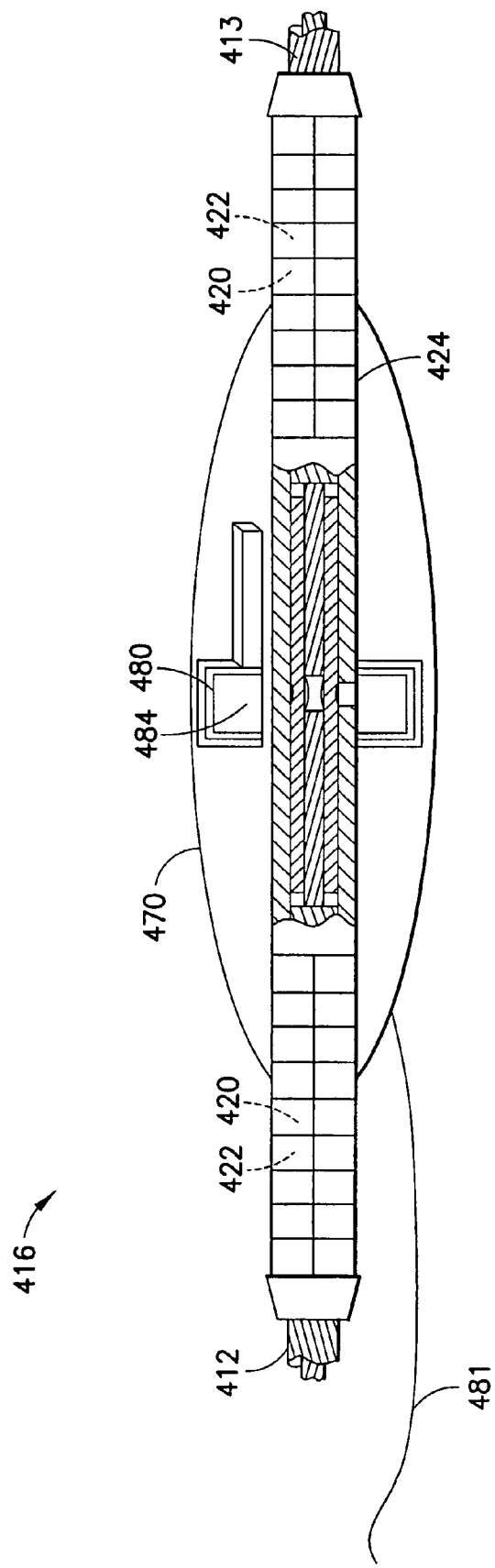
FIG. 20 is section view of a splice electrical connector incorporating features of the invention.

According to another embodiment of the invention, an electrical cable connector 416, which may be a splice electrical connector adapted to mechanically connect two cables 412, 413 to each other, is shown in FIG. 20. The electrical connector 416 generally comprises a sleeve section 424, an electronic sensing package 480, and a shield 470. The sleeve section 424 may comprise a tubular length of electrically conductive material. The sleeve section 424 may further be adapted to be connected, via displacement, to the transmission conductors 412, 413. It should be noted that although a single sleeve section 424 is shown in FIG. 20, alternate embodiments may comprise two sleeve sections. However, any suitable configuration may be provided. Similar to the dead end connector 316 described above, the splice connector 416 generally comprises a wedge sleeve 420 and wedges 422 proximate each end of the splice connector 416. The wedge sleeves 420 may be adapted to be threaded onto a middle connector member. The sleeve section 424 may be crimped onto the wires of the cables 412, 413. Similar splice electrical connectors (without the electronic sensing package, for example) and a method of attaching the connector to the cables is described in U.S. patent application Ser. No. 12/017,736 filed Jan. 22, 2008 which is hereby incorporated by reference in its entirety.

Figure 21:
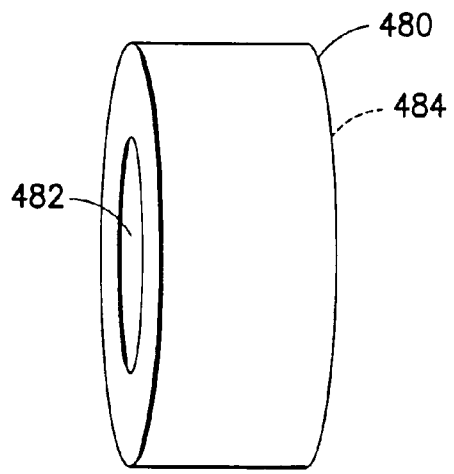
FIG. 21 is a front view of an electronic sensing package used in the splice connector shown in FIG. 20.
Figure 22:
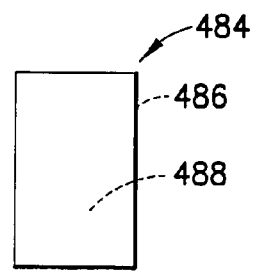
FIG. 22 is a front view of another electronic sensing package used in the splice connector shown in FIG. 20.

Referring now also to FIGS. 21 and 22, the electronic sensing package 480 may comprise a general ring shape with an opening 482. However, any suitable shape may be provided. The opening 482 may be suitably sized and shaped to be fitted around the sleeve section 424. The electronic sensing package 480 may be attached to the sleeve section 424 by any suitable method, such as a press fit for example. Additionally, the electronic sensing package 480 may be disposed on any suitable portion of the sleeve section 424, based on user preference, for example. The electronic sensing package 480 may comprise embedded electronics 484. The embedded electronics 484 may include one or more electronic components 486 and/or an electronic circuit 488. However, any suitable electronics may be provided. Similar to the embodiments presented above, the electronics 484 are configured to monitor one or more parameters of the cable conductor(s) 412, 413 connected to the connector 416. The electronic sensing package 480 may further comprise a non-conductive fiber optic link 481 for connection to a utility SCADA system.

The shield 470 may be provided proximate a middle section of the splice connector 416. The shield 470 is suitably sized and shaped to surround the electronic sensing package 480 and the middle section of the splice connector 416. The shield 470 may comprise a weather resistant electromagnetic and corona shield, for example. However, any suitable shield may be provided.

It should be understood that components of the invention can be operationally coupled or connected and that any number or combination of intervening elements can exist (including no intervening elements). The connections can be direct or indirect and additionally there can merely be a functional relationship between components.

It should be understood that the foregoing description is only illustrative of the invention. Various alternatives and modifications can be devised by those skilled in the art without departing from the invention. Accordingly, the invention is intended to embrace all such alternatives, modifications and variances which fall within the scope of the appended claims.

What is claimed is:

1. An apparatus comprising:
a first body comprising a first end, a second end opposite the first end, and a middle section between the first end and the second end, wherein the first body further comprises a first conductor receiving area and a recessed cavity, wherein the first conductor receiving area extends from the first end to the second end, and wherein the recessed cavity is at the middle section;
a second body adapted to be removably connected to the first body, wherein the second body comprises a first end, a second end, and a second conductor receiving area, wherein the second end is opposite the first end, wherein the second conductor receiving area extends from the first end of the second body to the second end of the second body, and wherein the apparatus is adapted to receive an electrical conductor between the first conductor receiving area and the second conductor receiving area; and
an electronic circuit at the cavity, wherein the electronic circuit is configured to receive reference information corresponding to the electrical conductor.

2. An apparatus as in claim 1 wherein the electronic circuit is configured to measure a voltage or a current of the electrical conductor.

3. An apparatus as in claim 1 further comprising a fiber optic cable connected to the electronic circuit.

4. An apparatus as in claim 1 wherein the second body is fastened to the first body.

5. An apparatus as in claim 1 further comprising a fiber optic cable connected to the electronic circuit, and wherein the electronic circuit is configured to measure a voltage or a current of the electrical conductor.

6. An apparatus as in claim 5 wherein the second body is fastened to the first body.

7. An apparatus as in claim 6 further comprising a plate member at the middle section, wherein the plate member covers the recessed cavity.

8. An apparatus as in claim 1 wherein the first body comprises an electrical wedge connector wedge member, and wherein the second body comprises an electrical wedge connector shell member.

9. An apparatus as in claim 8 wherein the wedge member is fastened to the shell member by a press fit or interference fit between the wedge member and the shell member.

10. An apparatus as in claim 1 wherein the first body comprises a suspension clamp upper body section, and wherein the second body comprises a suspension clamp lower body section.

11. An apparatus as in claim 10 wherein the suspension clamp upper body section is fastened to the suspension clamp lower body section by a threaded fastener.

12. An apparatus as in claim 1 wherein the electronic component is configured to sense a voltage of the electrical conductor in the range of about 5,000 volts to about 35,000 volts.

13. An apparatus as in claim 1 wherein the electronic component is configured to sense a voltage of the electrical conductor in the range of about 69,000 volts to about 765,000 volts.

14. An electrical wedge connector wedge comprising:
a first conductor groove adapted to receive a first conductor;
a second conductor groove opposite the first conductor groove, wherein the second conductor groove is adapted to receive a second conductor;
a middle section between the first conductor groove and the second conductor groove; and
at least one electronic component at the middle section, wherein the at least one electronic component is configured to monitor an electronic parameter of the first conductor;
wherein the electrical wedge connector wedge is adapted to be received by an electrical wedge connector shell.

15. An electrical wedge connector wedge as in claim 14 further comprising a printed wiring board at the middle section, wherein the electronic component is connected to the printed wiring board.

16. An electrical wedge connector wedge as in claim 15 further comprising an antenna connected to the printed wiring board.

17. An electrical wedge connector wedge as in claim 14 further comprising a conductive plate at the first conductor groove, wherein the conductive plate is electrically connected to the electronic component.

18. An electrical wedge connector wedge as in claim 14 further comprising a recessed cavity and a sensor lead, wherein the recessed cavity is at the middle section, wherein the electronic component is in the recessed cavity, and wherein the sensor lead extends from the recessed cavity to the first conductor groove.

19. An electrical wedge connector wedge as in claim 14 wherein the electronic component is configured to monitor a voltage or a current of the first conductor.

20. An electrical wedge connector comprising:
a C-shaped shell member; and
an electrical wedge connector wedge as in claim 14, wherein the wedge is insertable into the C-shaped shell member.

21. A conductor suspension clamp comprising:
a lower section comprising a lower groove portion, wherein the lower section is adapted to be connected to a transmission tower;
an upper section comprising a first member and a second member, wherein the first member comprises an upper groove portion and a cavity, wherein the conductor suspension clamp is adapted to receive an electrical conductor between the lower groove portion and the upper groove portion, and wherein at least a portion of the second member is at the cavity; and
an electronic component proximate the cavity, wherein the electronic component is configured to monitor a parameter of the electrical conductor.

22. A conductor suspension clamp as in claim 21 further comprising an electronic circuit at the cavity, wherein the electronic component is connected to the electronic circuit.

23. A conductor suspension clamp as in claim 22 further comprising an accelerometer, wherein the accelerometer is connected to the electronic circuit, and wherein the accelerometer is configured to derive a vibration reference from the electrical conductor.

24. A conductor suspension clamp as in claim 21 further comprising a faraday cage, wherein the faraday cage surrounds the cavity, and wherein the faraday cage is configured to derive a voltage reference from the electrical conductor.

25. A conductor suspension clamp as in claim 21 further comprising a thermocouple at the first member, wherein the thermocouple is configured to derive a temperature reference from the electrical conductor.

26. A conductor suspension clamp as in claim 21 further comprising a photo transistor, wherein the photo transistor is at the first member, and wherein the photo transistor is configured to provide an optical reference corresponding to the conductor suspension clamp.

27. A conductor suspension clamp as in claim 21 further comprising a bracket, wherein one end of the bracket is connected to the lower section, and wherein another end of the bracket is adapted to be connected to the transmission tower.

28. A method of manufacturing an electrical based apparatus comprising:
providing a first body having a first end, a second end opposite the first end, and a middle section between the first end and the second end, wherein the first body is adapted to be connected to a second body with a conductor therebetween;
providing a first conductor contact surface at a side of the first body between the first end and the second end;
forming a cavity at the middle section;
installing an electronic component proximate the cavity, wherein the electronic component is configured to monitor a parameter of the conductor; and
providing a plate member at the middle section, wherein the plate member covers the cavity.

29. A method as in claim 28 further comprising installing an electronic circuit at the cavity, wherein the electronic circuit is connected to the electronic component, and wherein the plate member covers the electronic circuit.

30. A method as in claim 29 further comprising connecting a fiber optic cable to the electronic circuit.

31. A method as in claim 28 further comprising fastening the second body to the first body.

32. A method as in claim 31 wherein the fastening of the second body to the first body further comprises fastening an electrical wedge connector shell member to an electrical wedge connector wedge member with a press fit configuration.

33. A method as in claim 31 wherein the fastening of the second body to the first body further comprises fastening a suspension clamp lower body section to a suspension clamp upper body section with a threaded fastener.

34. A method as in claim 31 wherein the second body is adapted to be connected to another conductor.

35. A method as in claim 31 wherein the second body is adapted to be connected to a transmission tower.

36. A method as in claim 28 further comprising connecting a sensor lead at the first body, wherein the sensor lead extends between the first conductor contact surface and the cavity.

37. A method as in claim 28 further comprising connecting a bracket to the apparatus, wherein the bracket extends substantially perpendicular to the first conductor contact surface, wherein the conductor is a transmission conductor, and wherein the apparatus is adapted to suspend the transmission conductor from a transmission tower.

* * * * *